US010777559B1

(12) United States Patent
Wu et al.

(10) Patent No.: US 10,777,559 B1
(45) Date of Patent: Sep. 15, 2020

(54) SEMICONDUCTOR MEMORY DEVICE AND MANUFACTURING METHOD THEREOF

(71) Applicant: UNITED MICROELECTRONICS CORP., Hsin-Chu (TW)

(72) Inventors: Po-Han Wu, Pingtung County (TW); Feng-Yi Chang, Tainan (TW); Fu-Che Lee, Taichung (TW); Wen-Chieh Lu, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/361,222

(22) Filed: Mar. 22, 2019

(30) Foreign Application Priority Data

Feb. 27, 2019 (CN) .......................... 2019 1 0144962

(51) Int. Cl.
*H01L 27/108* (2006.01)
(52) U.S. Cl.
CPC .. *H01L 27/10814* (2013.01); *H01L 27/10823* (2013.01); *H01L 27/10855* (2013.01); *H01L 27/10885* (2013.01)
(58) Field of Classification Search
CPC ......... H01L 27/10808; H01L 27/10814; H01L 27/10855; H01L 27/10885
See application file for complete search history.

(56) References Cited

U.S. PATENT DOCUMENTS

| 9,362,289 | B2 | 6/2016 | Park |
| 9,837,490 | B2 | 12/2017 | Park |
| 2016/0118247 | A1* | 4/2016 | Park ................. H01L 21/02247 438/703 |

* cited by examiner

*Primary Examiner* — Zandra V Smith
*Assistant Examiner* — Molly K Reida
(74) *Attorney, Agent, or Firm* — Winston Hsu

(57) ABSTRACT

A semiconductor memory device includes a semiconductor substrate, bit line structures, storage node contacts, isolation structures, a first spacer, a second spacer, and a third spacer. Each bit line structure is elongated in a first direction. The bit line structures are repeatedly arranged in a second direction. Each storage node contact and each isolation structure are disposed between two adjacent bit line structures. The first spacer is partly disposed between each isolation structure and the bit line structure adjacent to the isolation structure and partly disposed between each storage node contact and the bit line structure adjacent to the storage node contact. The second spacer is disposed between each storage node contact and the first spacer. The third spacer is disposed between each storage node contact and the second spacer. A thickness of the third spacer is less than a thickness of the second spacer in the second direction.

18 Claims, 10 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device and a manufacturing method thereof, and more particularly, to a semiconductor memory device including spacers with different thicknesses and a manufacturing method thereof.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

According to demands of products, the need to continuously increase the density of the memory cells in the array leads to more difficult and complex processes and design. For example, when the density of the memory cells increases, the distance between components in the memory cell becomes smaller and the influence of the shape variation of each component on the overall electrical performance becomes more obvious accordingly.

SUMMARY OF THE INVENTION

It is one of the objectives of the present invention to provide a semiconductor memory device and a manufacturing method thereof. Thicknesses of spacers are controlled for modifying a shape of storage node contact subsequently formed, and the purpose of improving the electrical performance of the semiconductor memory device may be achieved accordingly.

A semiconductor memory device is provided in an embodiment of the present invention. The semiconductor memory device includes a semiconductor substrate, a plurality of bit line structures, a plurality of storage node contacts, a plurality of isolation structures, a first spacer, a second spacer, and a third spacer. The bit line structures are disposed on the semiconductor substrate. Each of the bit line structures is elongated in a first direction, and the bit line structures are repeatedly arranged in a second direction. The storage node contacts are disposed on the semiconductor substrate. Each of the storage node contacts is disposed between two of the bit line structures adjacent to each other in the second direction. The isolation structures are disposed on the semiconductor substrate. Each of the isolation structures is disposed between two of the bit line structures adjacent to each other in the second direction, and each of the storage node contacts is disposed between two of the isolation structures adjacent to each other in the first direction. The first spacer is partly disposed between each of the isolation structures and one of the bit line structures adjacent to the isolation structure in the second direction and partly disposed between each of the storage node contacts and one of the bit line structures adjacent to the storage node contact in the second direction. The second spacer is disposed between each of the storage node contacts and the first spacer in the second direction. The third spacer is disposed between each of the storage node contacts and the second spacer in the second direction. A thickness of the third spacer in the second direction is less than a thickness of the second spacer in the second direction.

A manufacturing method of a semiconductor memory device is provided in an embodiment of the present invention. The manufacturing method includes the following steps. Firstly, a semiconductor substrate is provided. Bit line structures are formed on the semiconductor substrate. Each of the bit line structures is elongated in a first direction, and the bit line structures are repeatedly arranged in a second direction. A first spacer is formed on sidewalls of the bit line structures. A second spacer is formed on a sidewall of the first spacer. A third spacer is formed on a sidewall of the second spacer. A thickness of the third spacer in the second direction is less than a thickness of the second spacer in the second direction. Isolation structures are formed on the semiconductor substrate after the step of forming the third spacer. Each of the isolation structures is located between two of the bit line structures adjacent to each other in the second direction. Storage node contacts are formed on the semiconductor substrate. Each of the storage node contacts is located between two of the bit line structures adjacent to each other in the second direction, and each of the storage node contacts is located between two of the isolation structures adjacent to each other in the first direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-10 are schematic drawings illustrating a manufacturing method of a semiconductor device according to an embodiment of the present invention, wherein FIG. 5 is a schematic drawing in a step subsequent to FIG. 4, FIG. 6 is a schematic drawing in a step subsequent to FIG. 5, FIG. 7 is a cross-sectional diagram taken along a line C-C' in FIG. 6, FIG. 8 is a schematic drawing in a step subsequent to FIG. 6, FIG. 9 is a cross-sectional diagram taken along a line D-D' in FIG. 8, and FIG. 10 is a schematic drawing in a step subsequent to FIG. 8.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. For example, it is to be understood that the method of etching silicon involves patterning a photoresist layer over silicon and then removing silicon from the area that is not protected by the photoresist layer. Thus, after the etching process is complete, the silicon protected by the area of the photoresist layer will remain. In another example, the term "etch" may also refer to a method that does not use a photoresist, but leaves at least a portion of the material layer after the etch process is complete.

The above description may be used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
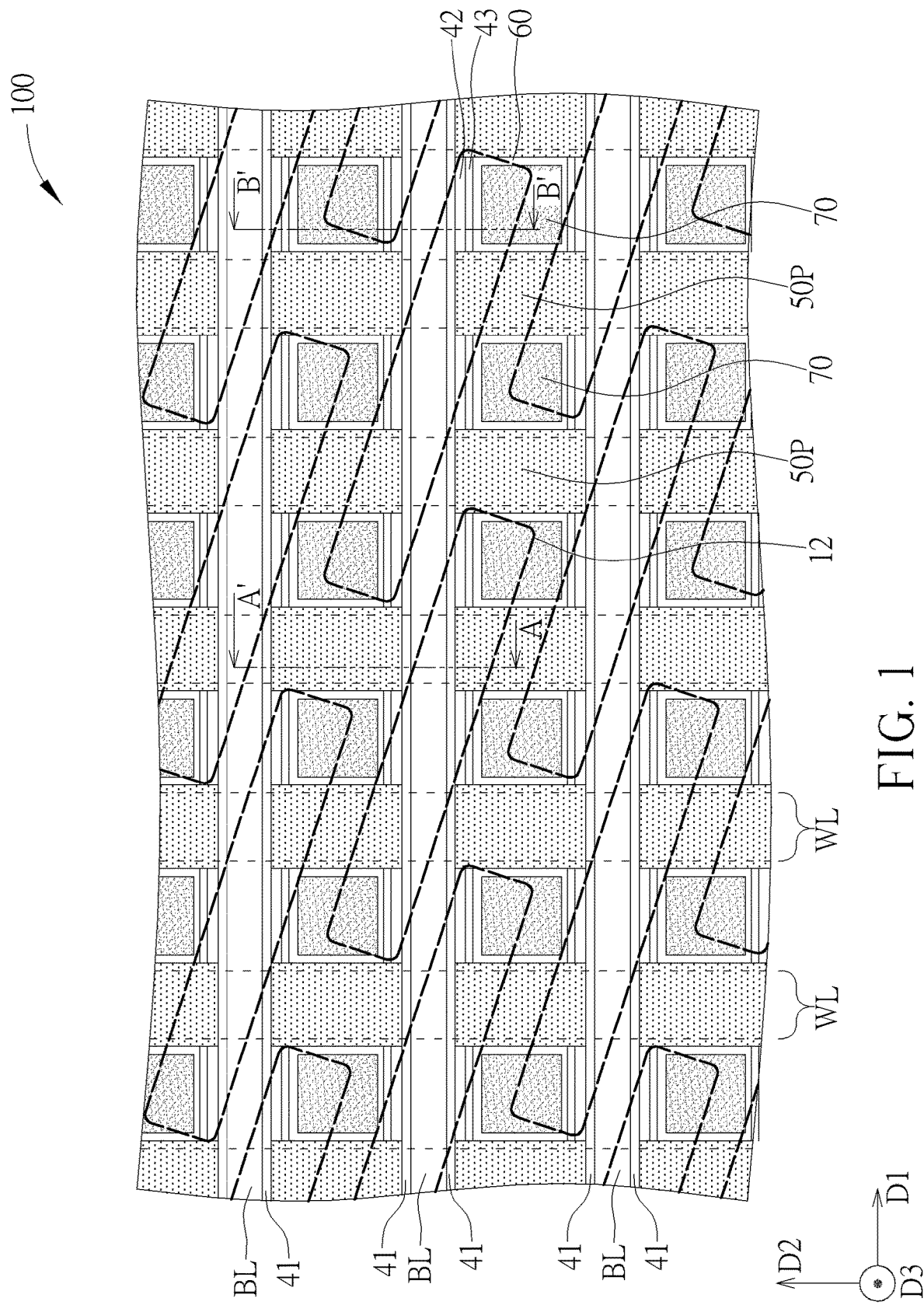
FIG. 1 is a top view schematic drawing illustrating a semiconductor memory device according to an embodiment of the present invention.
Figure 2:
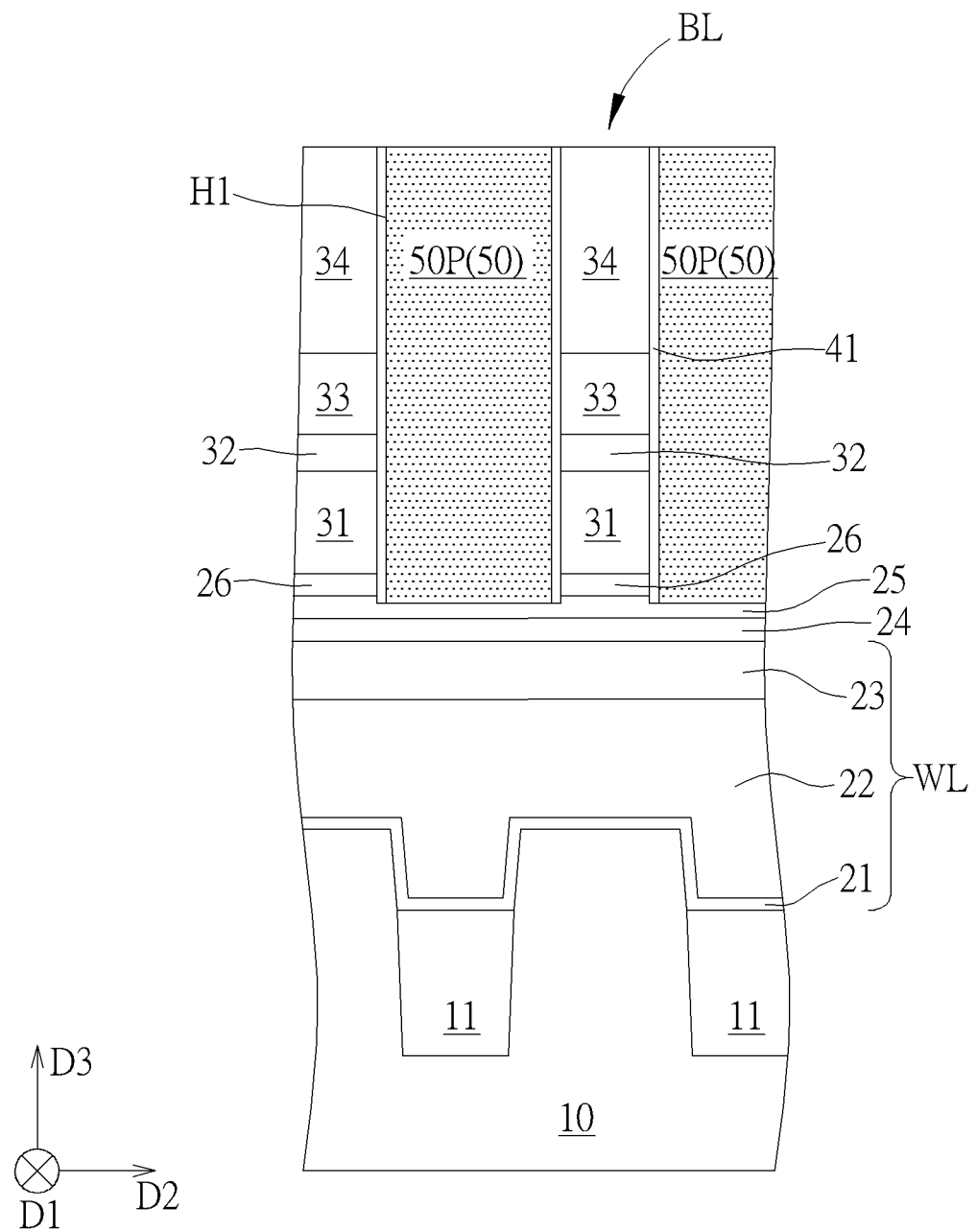
FIG. 2 is a cross-sectional diagram taken along a line A-A' in FIG. 1.
Figure 3:
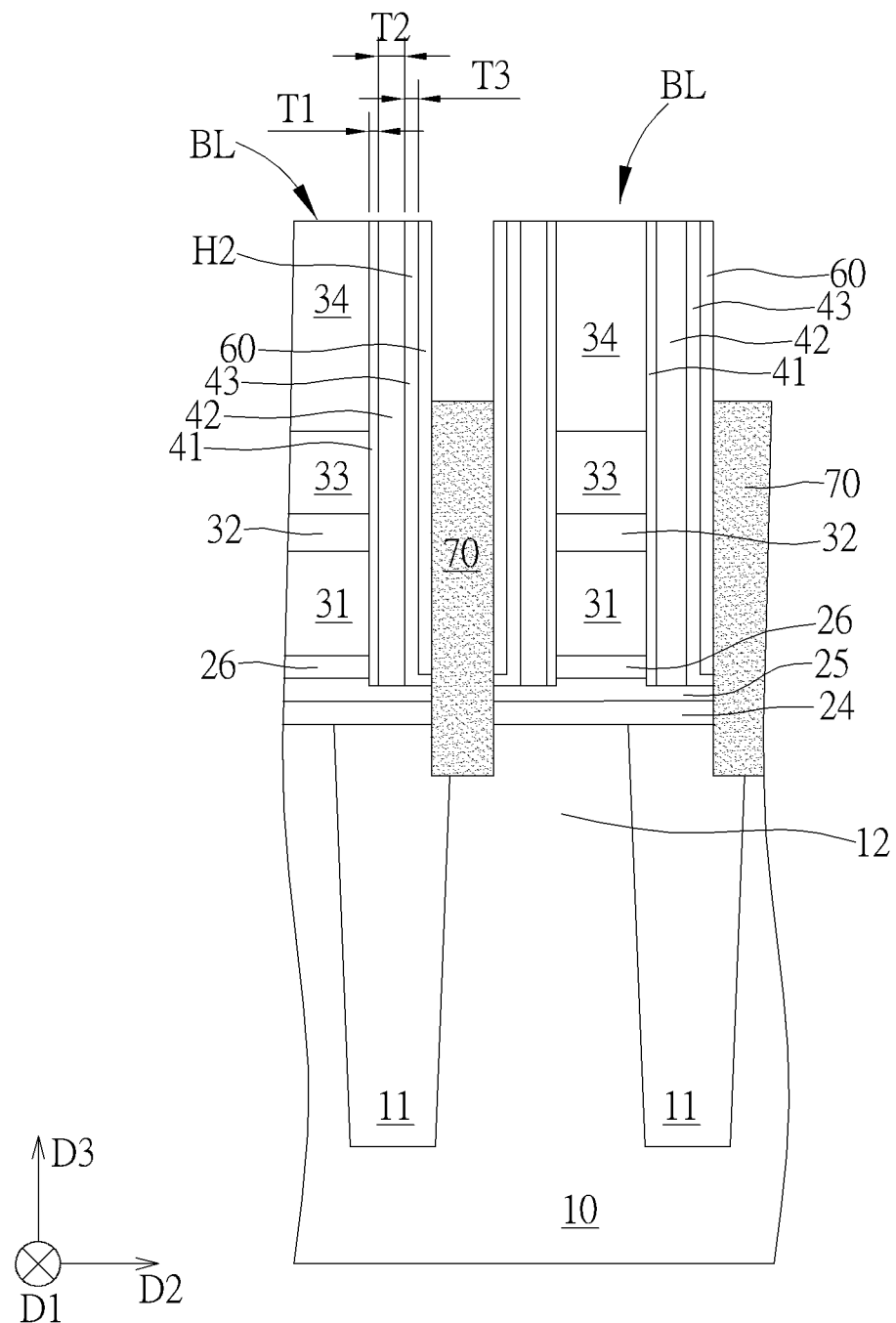
FIG. 3 is a cross-sectional diagram taken along a line B-B' in FIG. 1.

Please refer to FIGS. 1-3. FIG. 1 is a top view schematic drawing illustrating a semiconductor memory device according to an embodiment of the present invention, FIG. 2 is a cross-sectional diagram taken along a line A-A' in FIG. 1, and FIG. 3 is a cross-sectional diagram taken along a line B-B' in FIG. 1. As shown in FIGS. 1-3, a semiconductor memory device 100 is provided in this embodiment. The semiconductor memory device 100 includes a semiconductor substrate 10, a plurality of bit line structures BL, a plurality of storage node contacts 70, a plurality of isolation structures 50P, a first spacer 41, a second spacer 42, and a third spacer 43. The bit line structures BL, the storage node contacts 70, and the isolation structures 50P are disposed on the semiconductor substrate 10. Each of the bit line structures BL is elongated in a first direction D1, and the bit line structures BL are repeatedly arranged in a second direction D2. The first direction D1 is different from the second direction D2, and the first direction D1 is not parallel with the second direction D2. In some embodiments, the second direction D2 may be substantially orthogonal to the first direction D1, but not limited thereto. Each of the storage node contacts 70 is disposed between two of the bit line structures BL adjacent to each other in the second direction D2, and each of the isolation structures 50P is disposed between two of the bit line structures BL adjacent to each other in the second direction D2 also. Each of the storage node contacts 70 is disposed between two of the isolation structures 50P adjacent to each other in the first direction D1, and two of the storage node contacts 70 disposed adjacent to each other in the first direction D1 may be separated from each other by the isolation structure 50P.

The first spacer 41 is disposed on two opposite sidewalls of each of the bit line structures BL in the second direction D2. The second spacer 42 is disposed on a sidewall of the first spacer 41 and located at two opposite sides of each of the bit line structures BL in the second direction D2. The third spacer 43 is disposed on a sidewall of the second spacer 42 and located at the two opposite sides of each of the bit line structures BL in the second direction D2. In other words, the first spacer 41, the second spacer 42, and the third spacer 43 may be sequentially arranged in a direction from the sidewall of each of the bit line structures BL toward another bit line structure BL adjacent to this bit line structure BL (such as the second direction B2 or a direction opposite to the second direction D2).

The first spacer 41 is partly disposed between each of the isolation structures 50P and one of the bit line structures BL adjacent to this isolation structure 50P in the second direction D2, and the first spacer 41 is partly disposed between each of the storage node contacts 70 and one of the bit line structures BL adjacent to this storage node contact 70 in the second direction D2. The second spacer 42 is disposed between each of the storage node contacts 70 and the first spacer 41 in the second direction D2, and the second spacer 42 is not disposed between each of the isolation structures 50P and one of the bit line structures BL adjacent to this isolation structure 50P in the second direction D2. The third spacer 43 is disposed between each of the storage node contacts 70 and the second spacer 42 in the second direction D2, and the third spacer 43 is not disposed between each of the isolation structures 50P and one of the bit line structures BL adjacent to this isolation structure 50P in the second direction D2.

In other words, there may be the first spacer 41, the second spacer 42, and the third spacer 43 disposed in the space between each of the storage node contacts 70 and one of the bit line structures BL adjacent to this storage node contact 70, and there may be only the first spacer 41 disposed in the space between the each of the isolation structures 50P and one of the bit line structures BL adjacent to this isolation structure 50P. Therefore, in some embodiments, the first spacer 41 disposed between each of the isolation structures 50P and one of the bit line structures BL adjacent to this isolation structure 50P in the second direction D2 may directly contact this isolation structure 50P and the bit line structure BL, and a distance between each of the isolation structures 50P and one of the bit line structures BL adjacent to this isolation structure 50P in the second direction D2 may be smaller than or equal to a maximum thickness of the first spacer 41 in the second direction D2, but not limited thereto.

In this embodiment, a thickness of the third spacer 43 in the second direction D2 (such as a third thickness T3 shown in FIG. 3) is less than a thickness of the second spacer 42 in the second direction D2 (such as a second thickness T2 shown in FIG. 3), the residue of the second spacer 42 and the third spacer 43 remaining between the isolation structure 50P and the bit line structure BL in the step of forming the isolation structures 50P may be avoided by the thickness design described above, and electrical problems (such as leakage current between the storage node contact and the bit line structure BL and/or leakage current between the storage node contact 70 and a bit line contact), which may be caused by the storage node contact 70 formed subsequent to the isolation structures 50P and having a portion extending towards the region between the isolation structure 50P and the bit line structure BL, may be avoided accordingly. The influence of the thickness design of the spacers will be detailed in the manufacturing method of the present invention. As shown in FIG. 1, in some embodiments, from a top view of the semiconductor memory device 100, a shape of each of the storage node contacts 70 may be a rectangle without tips extending towards the region between the isolation structure 50P and the bit line structure BL, and the leakage current related problems described above may be improved accordingly. Additionally, in some embodiments, a thickness of the first spacer 41 in the second direction D2 (such as a first thickness T1 shown in FIG. 3) may be less than the second thickness T2 of the second spacer 42 in the second direction D2, and the first thickness T1 of the first spacer 41 may be less than the third thickness T3 of the third spacer 43 also, but not limited thereto.

In some embodiments, the material composition of the third spacer 43 may be different from the material composition of the second spacer 42, and the material composition of the second spacer 42 may be different from the material composition of the first spacer 41. For example, the third spacer 43 may be a nitride (such as silicon nitride) dielectric layer, the second spacer 42 may be an oxide (such as silicon oxide) dielectric layer, and the first spacer 41 may be another nitride dielectric layer, but not limited thereto. In some embodiments, other suitable dielectric materials may also be applied to form the first spacer 41, the second spacer 42, and the third spacer 43. Additionally, in some embodiments, the second spacer 42 may include an air spacer, but not limited thereto.

Specifically, as shown in FIGS. 1-3, in some embodiments, a shallow trench isolation 11 may be formed in the semiconductor substrate 10 for defining a plurality of active regions 12 in the semiconductor substrate 10. The shallow trench isolation 11 may include a single layer or multiple layers of insulation material, such as silicon nitride, silicon oxynitride, silicon carbonitride (SiCN), or other suitable insulation materials. The semiconductor substrate 10 may include a silicon substrate, an epitaxial substrate, a silicon germanium substrate, a silicon carbide substrate, or a silicon-on-insulator (SOI) substrate, but not limited thereto. Each of the bit line structures BL may include a first conductive layer 31, a barrier layer 32, a second conductive layer 33, and a bit line cap layer 34 stacked in a thickness direction of the semiconductor substrate 10 (such as a third direction D3 shown in FIGS. 1-3), but not limited thereto. The first conductive layer 31 may include non-metal conductive materials, such as polysilicon, amorphous silicon, or other non-metal conductive materials containing silicon or not. The barrier layer 32 may include titanium (Ti), tungsten silicide (WSi), tungsten nitride (WN), or other appropriate barrier materials. The second conductive layer 33 may include metal conductive materials, such as aluminum, tungsten, copper, titanium aluminide (TiAl), or other suitable metal conductive materials with low electrical resistivity. The bit line cap layer 34 may include silicon nitride, silicon oxynitride, silicon carbonitride, or other suitable insulation materials.

The storage node contact 70 may be electrically connected to the corresponding active region 12, and the storage node contacts 70 may be formed by filling holes (such as a second hole H2 shown in FIG. 3) surrounded by the isolation structures 50P and the bit line structures BL with a conductive material and performing an etching back process to the conductive material subsequently. Therefore, the topmost surfaces of the storage node contacts 70 may be lower than the topmost surfaces of the isolation structures 50P in the third direction D3, but not limited thereto. Additionally, the storage node contacts 70 may include silicon, such as amorphous silicon, polysilicon, or other conductive materials containing silicon. However, in some embodiments, the storage node contacts 70 may also be formed by other materials and/or other manufacturing processes according to other considerations.

Word line structures WL may be formed in the semiconductor substrate 10, and the word line structures WL in this embodiment may be buried word lines, but not limited thereto. Each of the word line structures WL may be elongated in the second direction D2, and each of the word line structures WL may include a word line dielectric layer 21, a word line 22, and a word line cap layer 23, but not limited thereto. Trenches may be formed in the semiconductor substrate 10, and the word line dielectric layer 21, the word line 22, and the word line cap layer 23 mentioned above may be sequentially formed in the trenches for forming the word line structures WL, but not limited thereto. In some embodiments, the other types of word line structures may also be applied according to other considerations. Additionally, the word line dielectric layer 21 may include silicon oxide or other suitable dielectric materials, the word line 22 may include aluminum, tungsten, copper, titanium aluminide, or other suitable conductive materials, and the word line cap layer 23 may include silicon nitride, silicon oxynitride, silicon carbonitride, or other suitable insulation materials.

Mask layers such as a first mask layer 24, a second mask layer 25, and a third mask layer 26 may be disposed on the word line structures WL, the bit line structure BL may be disposed on the third mask layer 26, and a contact hole (not shown) between the bit line structure BL and the corresponding active region 12 may penetrate the above mentioned mask layers for partially exposing the active region 12 corresponding to the bit line structure BL. In some embodiments, the semiconductor memory device 100 may further include a liner 60 surrounding each of the storage node contacts 70. The liner 60 may be partly disposed between each of the storage node contacts 70 and one of the bit line structures BL disposed adjacent to this storage node contact 70 in the second direction D2 and partly disposed between each of the storage node contacts 70 and one of the isolation structures 50P disposed adjacent to this storage node contact 70 in the first direction D1. The materials of the isolation structures 50P, the liner 60, the first mask layer 24, the second mask layer 25, and the third mask layer 26 may respectively include silicon nitride, silicon oxynitride, silicon carbonitride, or other suitable insulation materials, and the materials of the above mentioned parts may be modified according to process requirements, such as a requirement for etching selectivity.

Figure 4:
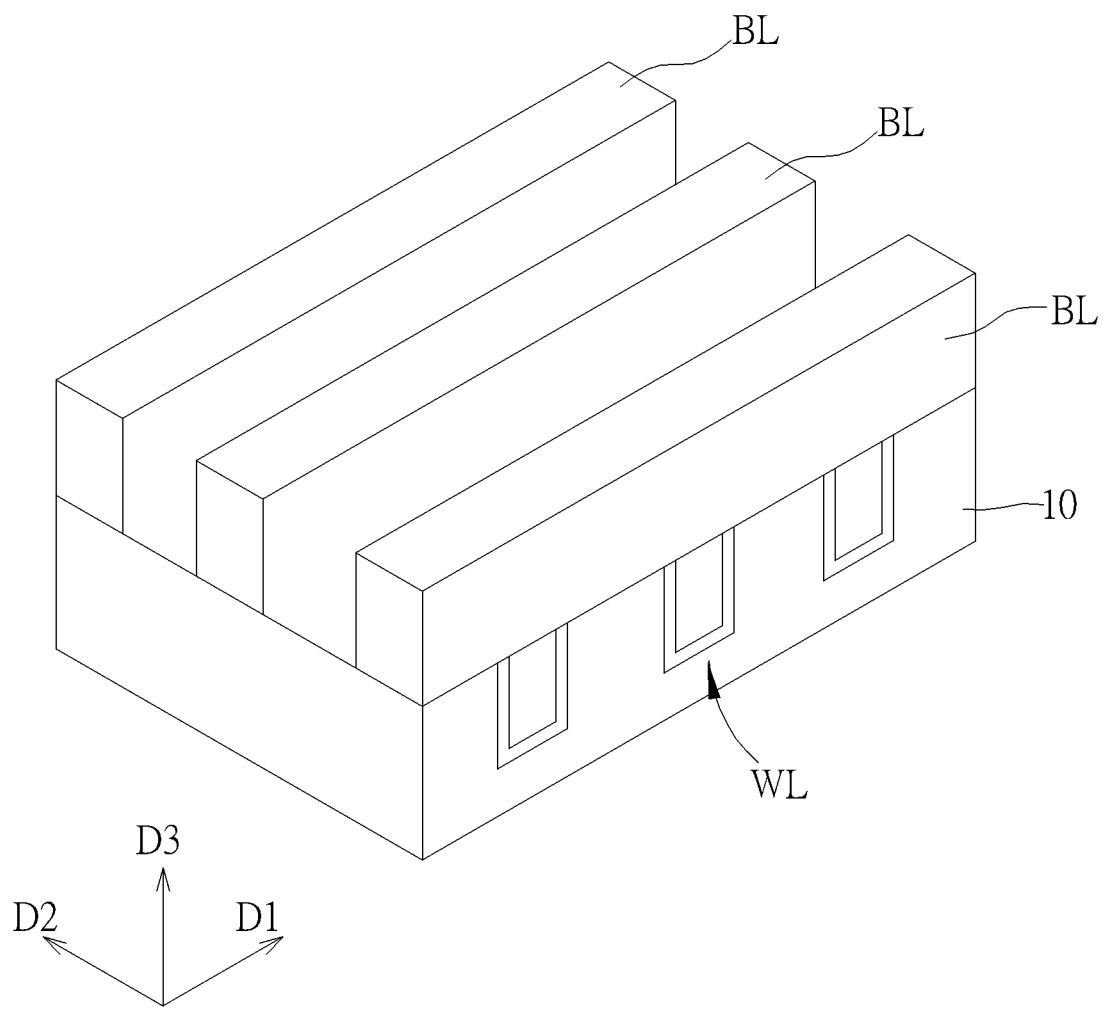
Figure 5:
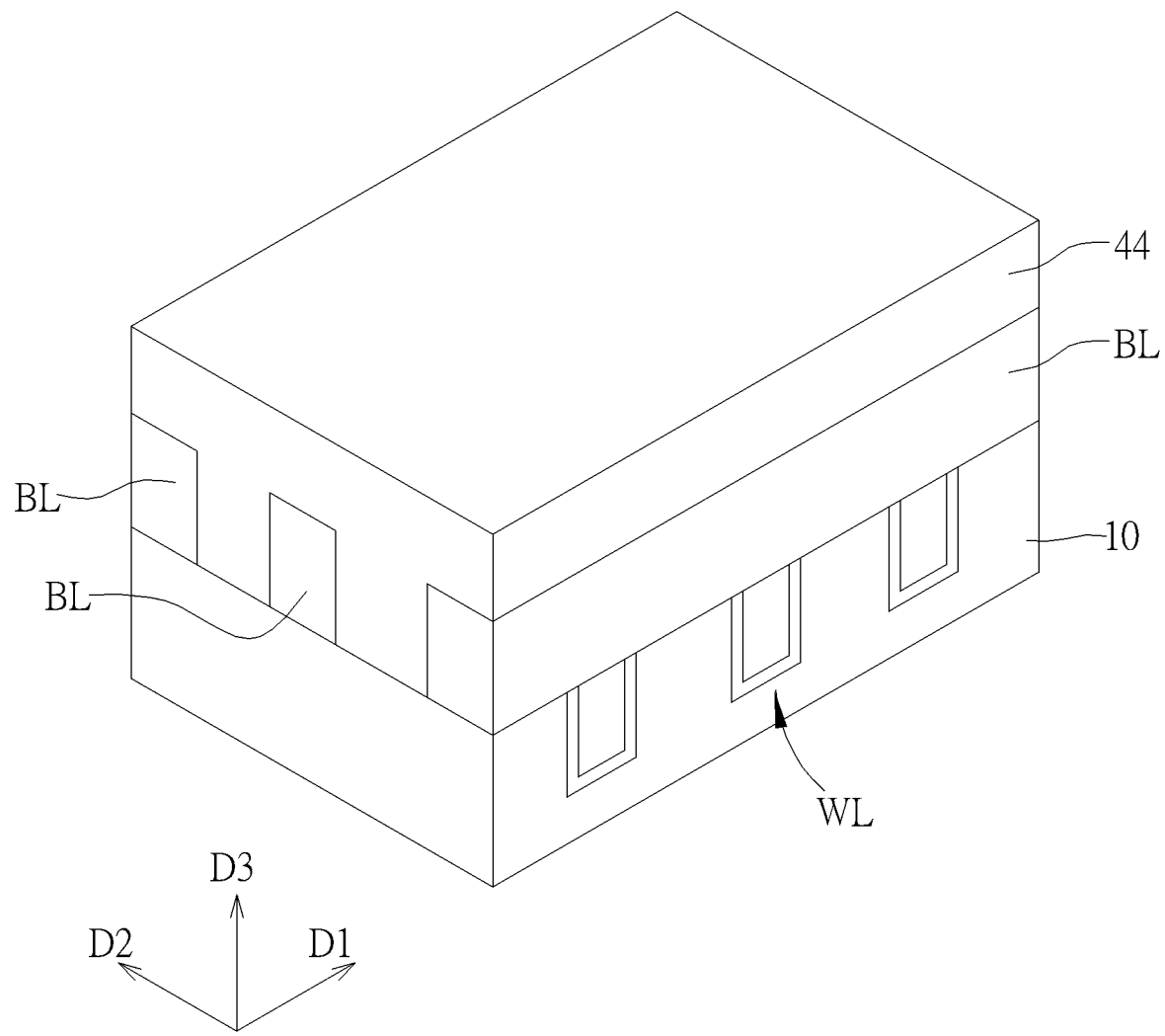
Figure 6:
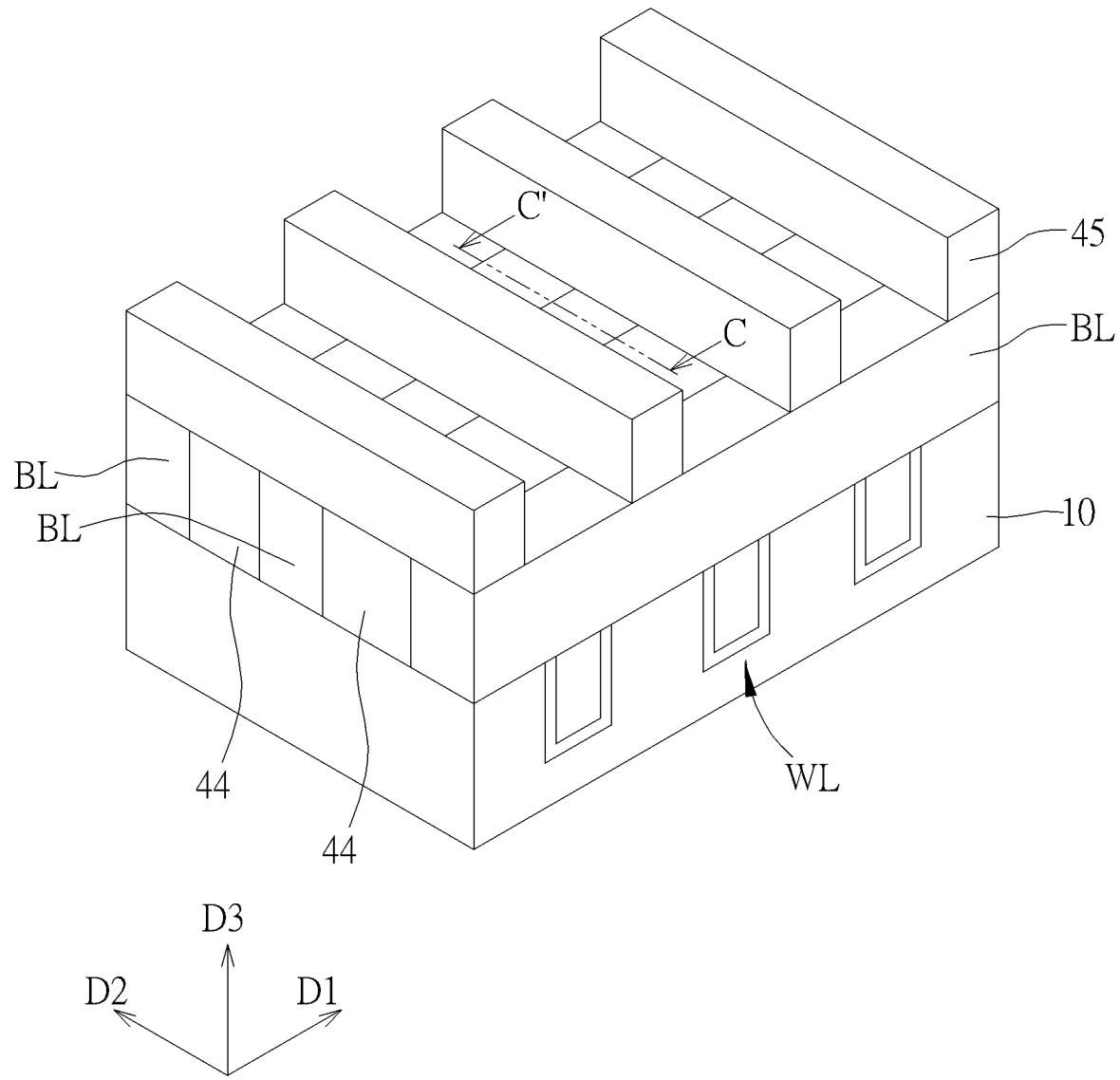
Figure 7:
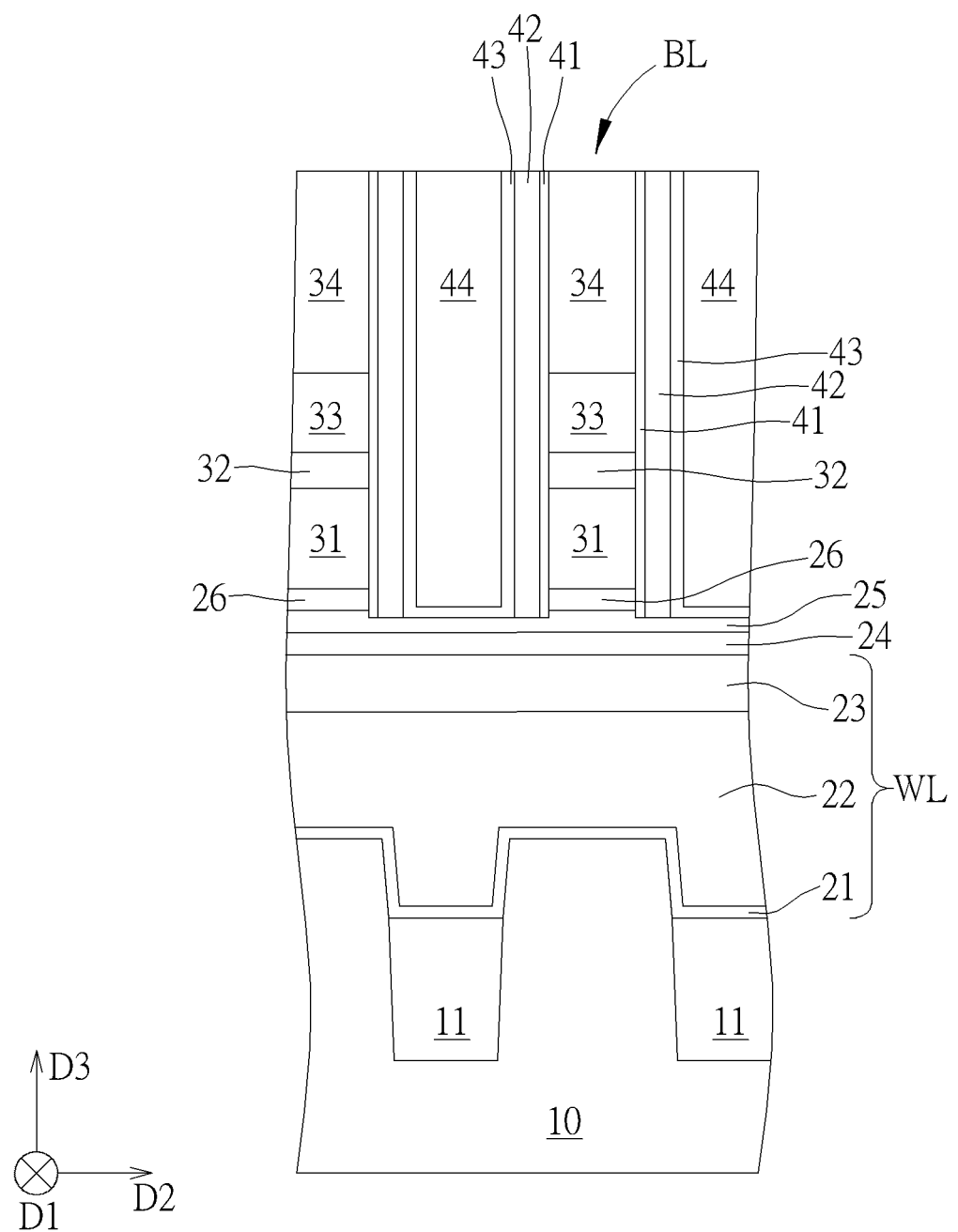
Figure 8:
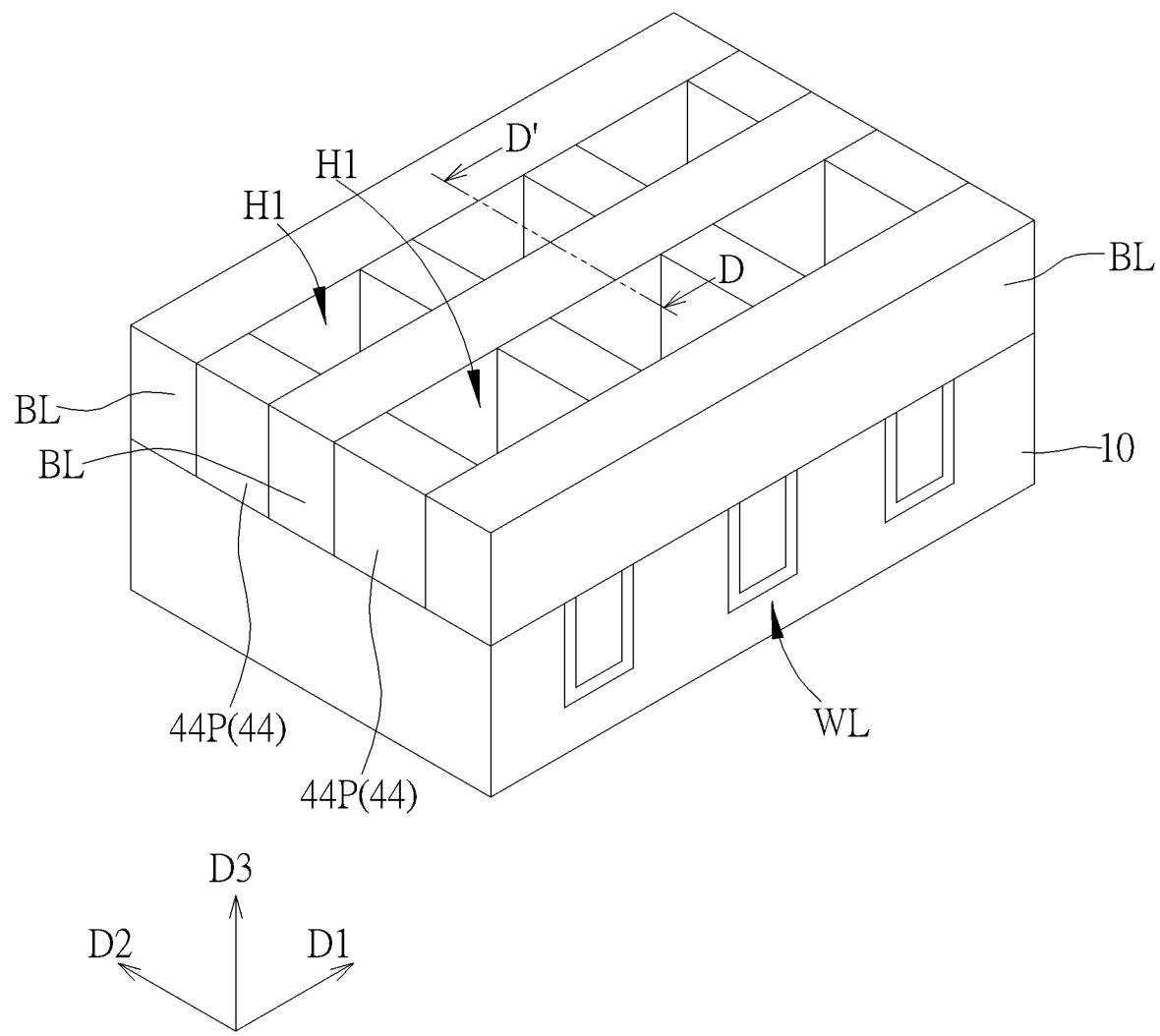
Figure 9:
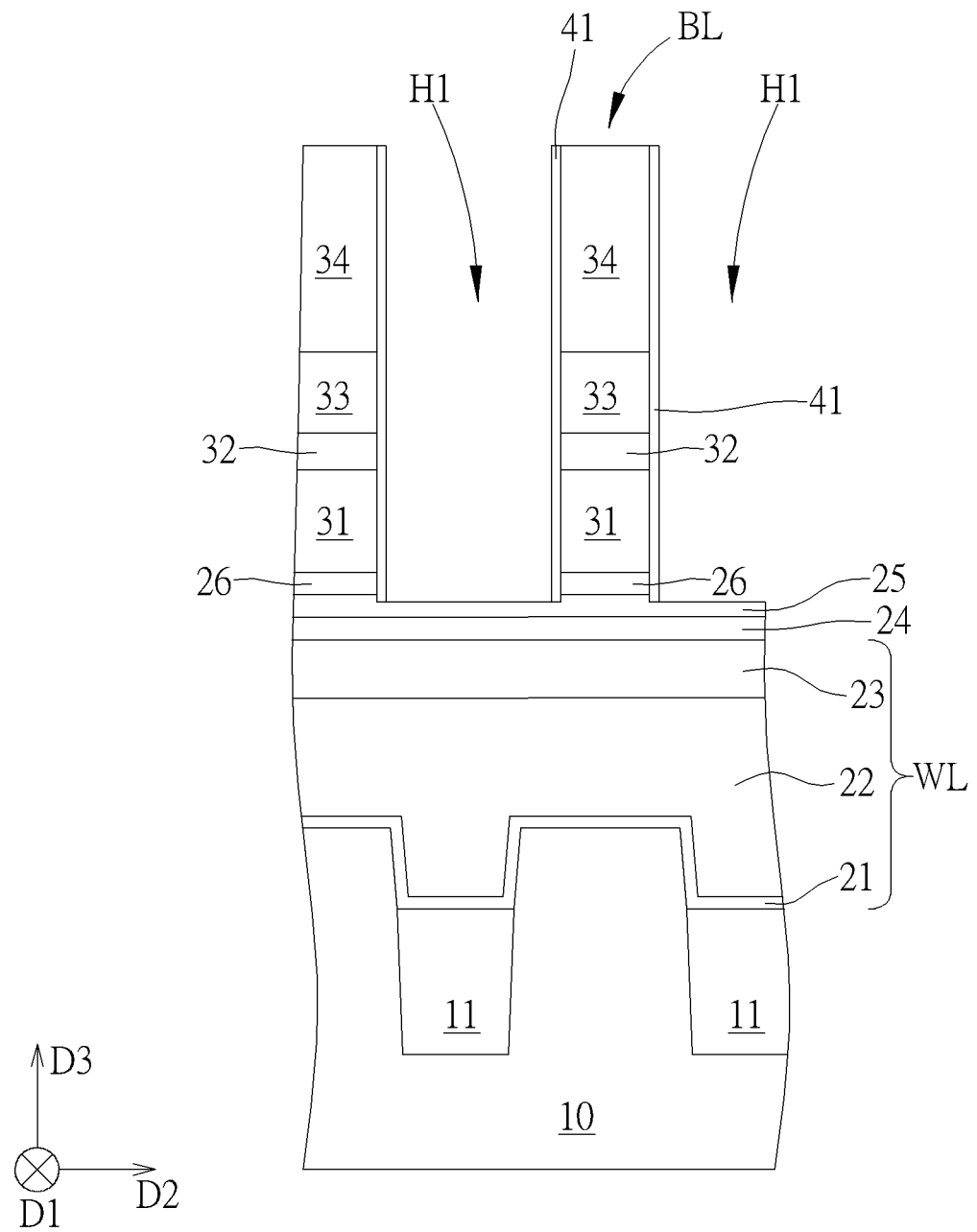
Figure 10:
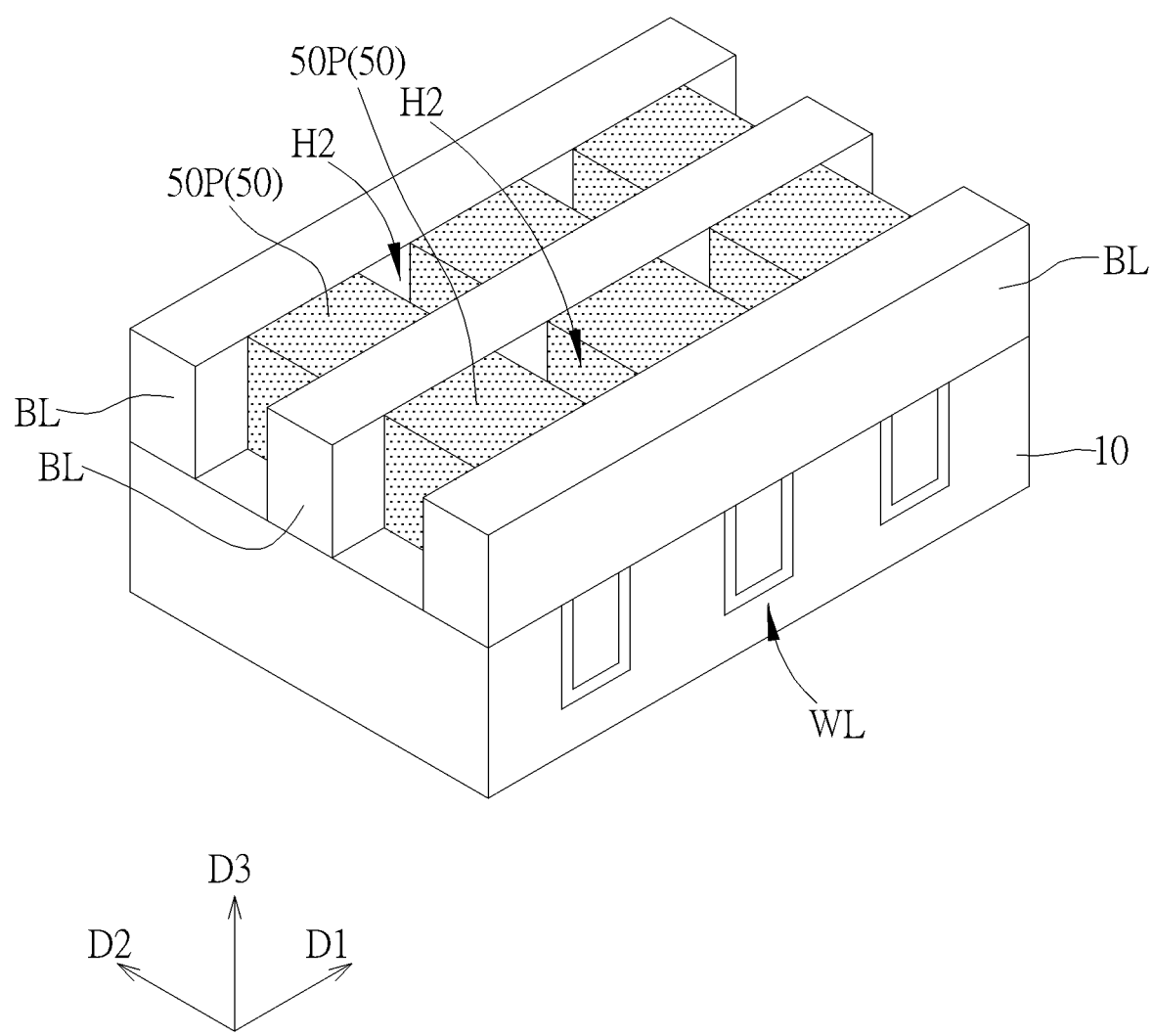

Please refer to FIGS. 1-10. FIGS. 4-10 are schematic drawings illustrating a manufacturing method of a semiconductor device according to an embodiment of the present invention. FIG. 4, FIG. 5, FIG. 6, FIG. 8, and FIG. 10 are stereoscopic schematic diagrams, and FIG. 7 and FIG. 9 are cross-sectional diagrams. FIG. 5 is a schematic drawing in a step subsequent to FIG. 4, FIG. 6 is a schematic drawing in a step subsequent to FIG. 5, FIG. 7 is a cross-sectional diagram taken along a line C-C' in FIG. 6, FIG. 8 is a schematic drawing in a step subsequent to FIG. 6, FIG. 9 is a cross-sectional diagram taken along a line D-D' in FIG. 8, FIG. 10 is a schematic drawing in a step subsequent to FIG. 8, and FIGS. 1-3 may be regarded as schematic drawings in a step subsequent to FIG. 10. As shown in FIGS. 1-3, the manufacturing method of the semiconductor memory device in this embodiment may include the following steps. Firstly, the semiconductor substrate 10 is provided. The bit line structures BL are formed on the semiconductor substrate 10. Each of the bit line structures BL is elongated in the first direction D1, and the bit line structures BL are repeatedly disposed in the second direction D2. The first spacer 41 is formed on the sidewalls of the bit line structures BL. The second spacer 42 is formed on the sidewall of the first spacer 41. The third spacer 43 is formed on the sidewall of the second spacer 42. The third thickness T3 of the third spacer 43 in the second direction D2 is less than the second thickness T2 of the second spacer 42 in the second direction D2. After the step of forming the third spacer 43, the isolation structures 50P are formed on the semiconductor substrate 10. Each of the isolation structures 50P is located between two of the bit line structures BL adjacent to each other in the second direction D2. The storage node contacts 70 are formed on the semiconductor substrate 10. Each of the storage node contacts 70 is located between two of the bit line structures BL adjacent to each other in the second direction D2, and each of the storage node contacts 70 is located between two of the isolation structures 70 adjacent to each other in the first direction D1.

Specifically, the manufacturing method of the semiconductor device 100 in this embodiment may include but is not limited to the following steps. Firstly as shown in FIG. 4, the bit line structures BL, the first spacer, the second spacer, and the third spacer described above are formed on the semiconductor substrate 10. It should be noted that, for the simplicity of the figures, the first spacer, the second spacer, and the third spacer described above are not shown in the stereoscopic diagrams, such as FIG. 4, FIG. 5, FIG. 6, FIG. 8, and FIG. 10. Subsequently, the isolation structures are formed on the semiconductor substrate 10. In some embodiments, the method for forming the isolation structures may include the following steps. As shown in FIG. 5, a dielectric material 44 is formed covering the bit line structures BL and the semiconductor substrate 10. In some embodiments, the dielectric material 44 may include spin on dielectric (SOD) or other dielectric materials having great gap-filling ability, and the dielectric material 44 may be able to be formed between the bit line structures BL accordingly. As shown in FIG. 5 and FIG. 6, after the step of forming the dielectric material 44, a planarization process, such as a chemical mechanical polishing (CMP) process, may be performed for removing the dielectric material 44 above the bit line structures BL, and a patterned mask 45 may be formed on the dielectric material 44 and the bit line structures BL subsequently. As shown in FIG. 6 and FIG. 7, the first spacer 41, the second spacer 42, and the third spacer 43 are located between each of the bit line structures BL and the dielectric material 44.

As shown in FIGS. 6-9, a part of the dielectric material 44 is removed for forming a plurality of first holes H1 penetrating the dielectric material 44. In some embodiments, the patterned mask 45 may be used as an etching mask in an etching process performed to the dielectric material 44 for forming the first holes H1. The patterned mask 45 may be removed after the step of forming the first holes H1, and the dielectric material 44 may be etched to be a dielectric pattern 44P. In some embodiments, the second spacer 42 and the third spacer 43 located between each of the bit line structures BL and the dielectric material 44 corresponding to the first holes H1 (i.e. the part of the dielectric material 44 removed for forming the first holes H1) may be removed concurrently by the step of forming the first holes H1. In other words, after the step of forming the first holes H1, the second spacer 42 and the third spacer 43 are not located between each of the first holes H1 and one of the bit line structures BL adjacent to this first hole H1 in the second direction D2.

For instance, the etching process for forming the first holes H1 may include a dry etching process, there will not be too many etching byproducts (such as polymers) formed on the top surface of the third spacer 43 during the dry etching process and the third spacer 43 will not remain between the first hole H1 and the bit line structure BL because the third spacer 43 is relatively thinner. Additionally, because of related process requirements for the second spacer 42 (such as being removed for forming an air spacer in the subsequent processes), the second spacer 42 has to be formed with a specific thickness, and the third thickness T3 of the third spacer 43 will be less than the second thickness T2 of the second spacer 42 accordingly. Therefore, the third spacer 43 and the second spacer 42 located between the first hole H1 and the bit line structure BL may be removed concurrently by the etching process of forming the first holes because of the third spacer 43 that is relatively thinner. Additionally, there will be more etching byproducts accumulating on the top surface of the bit line cap layer 34 in the etching process of forming the first holes H1, and the first space 41 located between the first hole H1 and the bit line structure BL will not be totally removed because the etching byproducts may further cover the first spacer 41 adjacent to the bit line cap layer 34 during the etching process.

Subsequently, as shown in FIGS. 8-10 and FIGS. 1-3, the isolation structures 50P are formed, and each of the isolation structures 50P may be formed in one of the first holes H1. In some embodiments, the first holes H1 may be filled with an isolation material 50 and an etching back process may be performed to the isolation material 50 for forming the isolation structures 50 separated from one another. The isolation material 50 may include nitride, such as silicon carbonitride or other suitable insulation materials. As shown in FIG. 9, FIG. 1, and FIG. 2, a distance between each of the isolation structures 50P and one of the bit line structures BL adjacent to this isolation structure 50P in the second direction D2 may be smaller than or equal to a maximum thickness of the first spacer 41 in the second direction D2 because the second spacer 42 and the third spacer 43 located between each of the bit line structures BL and the dielectric material 44 corresponding to the first holes H1 may be removed concurrently by the etching process of forming the first holes and the first spacer 41 may be partially etched by the etching process of forming the first holes H1.

As shown in FIGS. 8-10 and FIGS. 1-3, after the step of forming the isolation structures 50P, the dielectric material 44 may be removed for forming a plurality of second holes H2, and each of the second holes H2 may be located between two of the isolation structures 50P adjacent to each other in the first direction D1. In some embodiments, the method for removing the dielectric material 44 may include a wet etching process, such as a BOE etching process, or other suitable etching processes. The liner 60 may then conformally formed in the second holes H2. The liner 60 may include a single layer or multiple layers of insulation material, such as silicon oxide, silicon nitride, or other suitable insulation materials. After the step of forming the liner 60, an etching process may be performed for etching downwards from the second holes H2 for exposing the corresponding active regions 12. Subsequently, the storage node contacts 70 may be formed in the second holes H2, and each of the storage node contacts 70 may be formed in one of the second holes H2.

As shown in FIGS. 1-3, a part of the first spacer 41 is located between each of the isolation structures 50P and one of the bit line structures BL adjacent to this isolation structure 50P in the second direction D2. The first spacer 41 located between each of the isolation structures 50P and one of the bit line structures BL adjacent to this isolation structure 50P in the second direction D2 may directly contact this isolation structure 50P and the bit line structure BL because the second spacer 42 and the third spacer 43 are not located between each of the isolation structures 50P and one of the bit line structures BL adjacent to this isolation structure 50P in the second direction D2. By the manufacturing method of the present invention, the second spacer 42 and the third spacer 43 will not remain between the isolation structure 50P and the bit line structure BL in the step of forming the isolation structures 50P, and the shape of the storage node contact 70 subsequently formed will not be influenced accordingly. In some embodiments, the shape of each of the storage node contacts 70 may be a rectangle without tips extending towards the region between the isolation structure 50P and the bit line structure BL, the leakage current problem between the storage node contact 70 and the bit line structure BL may be improved, and the electrical performance of the semiconductor memory device 100 may be enhanced accordingly.

To summarize the above descriptions, according to the semiconductor memory device and the manufacturing method thereof in the present invention, the thickness of each of the spacers may be controlled for modifying the shape of the storage node contact subsequently formed. The storage node contacts may be formed without having tips extending towards the region between the isolation structure and the bit line structure, and the purpose of improving the electrical performance of the semiconductor memory device may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a semiconductor substrate;
   a plurality of bit line structures disposed on the semiconductor substrate, wherein each of the bit line structures is elongated in a first direction, and the bit line structures are repeatedly arranged in a second direction;
   a plurality of storage node contacts disposed on the semiconductor substrate, wherein each of the storage node contacts is disposed between two of the bit line structures adjacent to each other in the second direction;
   a plurality of isolation structures disposed on the semiconductor substrate, wherein each of the isolation structures is disposed between two of the bit line structures adjacent to each other in the second direction, and each of the storage node contacts is disposed between two of the isolation structures adjacent to each other in the first direction;
   a first spacer partly disposed between each of the isolation structures and one of the bit line structures adjacent to the isolation structure in the second direction and partly disposed between each of the storage node contacts and one of the bit line structures adjacent to the storage node contact in the second direction;
   a second spacer disposed between each of the storage node contacts and the first spacer in the second direction; and
   a third spacer disposed between each of the storage node contacts and the second spacer in the second direction, wherein a thickness of the third spacer in the second direction is less than a thickness of the second spacer in the second direction, and a distance between each of the isolation structures and one of the bit line structures adjacent to the isolation structure in the second direction is smaller than or equal to a maximum thickness of the first spacer in the second direction.

2. The semiconductor memory device according to claim 1, wherein a material composition of the third spacer is different from a material composition of the second spacer.

3. The semiconductor memory device according to claim 2, wherein the material composition of the second spacer is different from a material composition of the first spacer.

4. The semiconductor memory device according to claim 1, wherein the first spacer disposed between each of the isolation structures and one of the bit line structures adjacent to the isolation structure in the second direction directly contacts the isolation structure and the bit line structure.

5. The semiconductor memory device according to claim 1, wherein the second spacer and the third spacer are not disposed between each of the isolation structures and one of the bit line structures adjacent to the isolation structure in the second direction.

6. The semiconductor memory device according to claim 1, wherein a shape of each of the storage node contacts is a rectangle from a top view of the semiconductor memory device.

7. The semiconductor memory device according to claim 1, wherein a thickness of the first spacer in the second direction is less than the thickness of the second spacer in the second direction.

8. A manufacturing method of a semiconductor memory device, comprising:
   providing a semiconductor substrate;
   forming a plurality of bit line structures on the semiconductor substrate, wherein each of the bit line structures is elongated in a first direction, and the bit line structures are repeatedly arranged in a second direction;
   forming a first spacer on sidewalls of the bit line structures;
   forming a second spacer on a sidewall of the first spacer;
   forming a third spacer on a sidewall of the second spacer, wherein a thickness of the third spacer in the second direction is less than a thickness of the second spacer in the second direction;
   forming a plurality of isolation structures on the semiconductor substrate after the step of forming the third spacer, wherein each of the isolation structures is located between two of the bit line structures adjacent to each other in the second direction; and
   forming a plurality of storage node contacts on the semiconductor substrate, wherein each of the storage node contacts is located between two of the bit line structures adjacent to each other in the second direction, and each of the storage node contacts is located between two of the isolation structures adjacent to each other in the first direction;
   wherein a distance between each of the isolation structures and one of the bit line structures adjacent to the isolation structure in the second direction is smaller than or equal to a maximum thickness of the first spacer 5 in the second direction.

9. The manufacturing method of the semiconductor memory device according to claim 8, wherein the step of forming the isolation structures comprises:
   forming a dielectric material between the bit line structures, wherein the first spacer, the second spacer, and the third spacer are located between each of the bit lines structures and the dielectric material;
   removing a part of the dielectric material for forming a plurality of first holes penetrating the dielectric material, wherein each of the isolation structures is formed in one of the first holes; and removing the dielectric material for forming a plurality of second holes after the step of forming the isolation structures, wherein each of the second holes is located between two of the isolation structures adjacent to each other in the first direction;

wherein a distance between each of the isolation structures and one of the bit line structures adjacent to the isolation structure in the second direction is smaller than or equal to a maximum thickness of the first spacer in the second direction.

10. The manufacturing method of the semiconductor memory device according to claim 9, wherein the second spacer located between each of the bit lines structures and the dielectric material corresponding to the first holes and the third spacer located between each of the bit lines structures and the dielectric material corresponding to the first holes are removed by the step of forming the first holes.

11. The manufacturing method of the semiconductor memory device according to claim 10, wherein the second spacer and the third spacer are not located between each of the first holes and one of the bit line structures adjacent to the first hole in the second direction after the step of forming the first holes.

12. The manufacturing method of the semiconductor memory device according to claim 9, wherein each of the storage node contacts is formed in one of the second holes.

13. The manufacturing method of the semiconductor memory device according to claim 8, wherein a material composition of the third spacer is different from a material composition of the second spacer.

14. The manufacturing method of the semiconductor memory device according to claim 13, wherein the material composition of the second spacer is different from a material composition of the first spacer.

15. The manufacturing method of the semiconductor memory device according to claim 8, wherein a part of the first spacer is located between each of the isolation structures and one of the bit line structures adjacent to the isolation structure in the second direction, and the first spacer located between each of the isolation structures and one of the bit line structures adjacent to the isolation structure in the second direction directly contacts the isolation structure and the bit line structure.

16. The manufacturing method of the semiconductor memory device according to claim 8, wherein the second spacer and the third spacer are not located between each of the isolation structures and one of the bit line structures adjacent to the isolation structure in the second direction.

17. The manufacturing method of the semiconductor memory device according to claim 8, wherein a shape of each of the storage node contacts is a rectangle from a top view of the semiconductor memory device.

18. The manufacturing method of the semiconductor memory device according to claim 8, wherein a thickness of the first spacer in the second direction is less than the thickness of the second spacer in the second direction.

* * * * *